United States Patent
Deshpande et al.

(10) Patent No.: US 10,600,460 B2
(45) Date of Patent: Mar. 24, 2020

(54) PERPENDICULAR MAGNETIC MEMORY USING SPIN-ORBIT TORQUE

(71) Applicant: Everspin Technologies, Inc., Chandler, AZ (US)

(72) Inventors: Sarin Deshpande, Chandler, AZ (US); Sanjeev Aggarwal, Scottsdale, AZ (US); Jason Janesky, Gilbert, AZ (US); Jon Slaughter, Albany, NY (US); Phillip Lopresti, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 16/157,315

(22) Filed: Oct. 11, 2018

(65) Prior Publication Data

US 2019/0115060 A1    Apr. 18, 2019

Related U.S. Application Data

(60) Provisional application No. 62/571,807, filed on Oct. 13, 2017.

(51) Int. Cl.
*G11C 11/16* (2006.01)
*H01F 10/32* (2006.01)
(Continued)

(52) U.S. Cl.
CPC ........ *G11C 11/161* (2013.01); *G11C 11/1653* (2013.01); *G11C 11/1659* (2013.01);
(Continued)

(58) Field of Classification Search
CPC .............. G11C 11/161; G11C 11/1653; G11C 11/1673
(Continued)

(56) References Cited

U.S. PATENT DOCUMENTS 9,525,126 B1    12/2016   Lin
2012/0155153 A1*  6/2012   Shukh .................... G11C 11/16
                                                      365/158
(Continued)

FOREIGN PATENT DOCUMENTS

WO   WO 2017/034563 A1   3/2017
WO   WO 2017/208880 A1   12/2017

OTHER PUBLICATIONS

International Search Report dated Jan. 29, 2019 for PCT/US2018/055357, 6 pages.

*Primary Examiner* — Han Yang
(74) *Attorney, Agent, or Firm* — Bookoff McAndrews, PLLC

(57) ABSTRACT

Spin-orbit-torque (SOT) control strip lines are provided along the sides of free layers in perpendicular magnetic tunnel junction devices. Current flowing through such SOT control strip lines injects spin current into the free layers such that spin torque is applied to the free layers. The spin torque can be used to force the magnetic state of the free layer to a particular state based on the direction of the current through the SOT control strip line. In other embodiments, the SOT provides an assist to spin-transfer torque generated by current flowing vertically through the magnetic tunnel junction. Some embodiments have dedicated strip lines for a single magnetic tunnel junction such that a three-terminal device results. Other embodiments have multiple magnetic tunnel junctions sharing a strip line, where the strip line can be used to reset all of the magnetic tunnel junctions to the same state and can also be used as an assist such that individual magnetic tunnel junctions can be written using selection circuitry.

22 Claims, 8 Drawing Sheets

(51) Int. Cl.
   *H01L 27/22* (2006.01)
   *H01L 43/02* (2006.01)
(52) U.S. Cl.
   CPC ...... *G11C 11/1673* (2013.01); *G11C 11/1693* (2013.01); *H01F 10/329* (2013.01); *H01F 10/3254* (2013.01); *H01F 10/3272* (2013.01); *H01F 10/3286* (2013.01); *H01L 27/228* (2013.01); *H01L 43/02* (2013.01); *G11C 11/1675* (2013.01)
(58) Field of Classification Search
   USPC .......................................... 365/158, 171, 173
   See application file for complete search history.

(56) References Cited

U.S. PATENT DOCUMENTS

| | | | |
|---|---|---|---|
| 2014/0056060 A1 | 2/2014 | Khvalkovskiy et al. | |
| 2016/0142012 A1* | 5/2016 | Wang | H03B 15/006 331/94.1 |
| 2017/0178705 A1* | 6/2017 | Buhrman | H01L 43/08 |
| 2018/0268886 A1 | 9/2018 | Ishikawa et al. | |

* cited by examiner

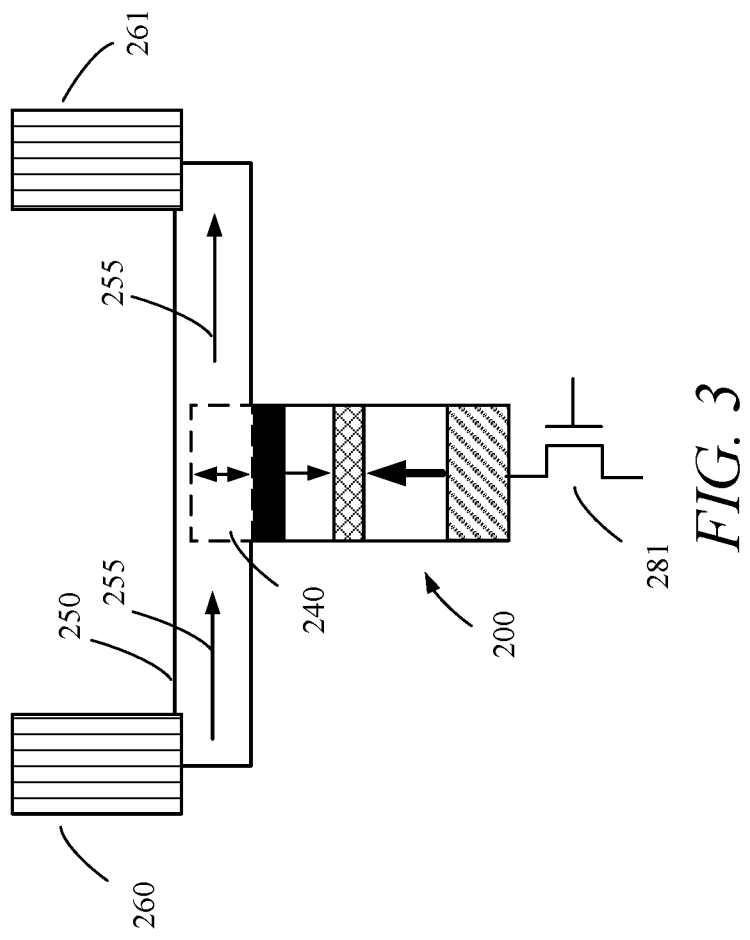
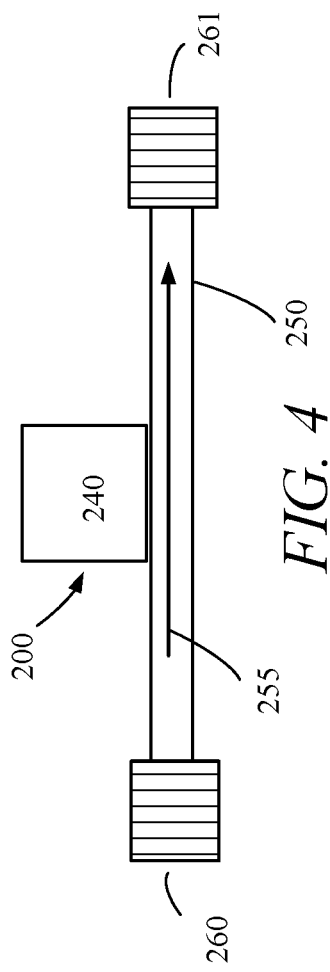

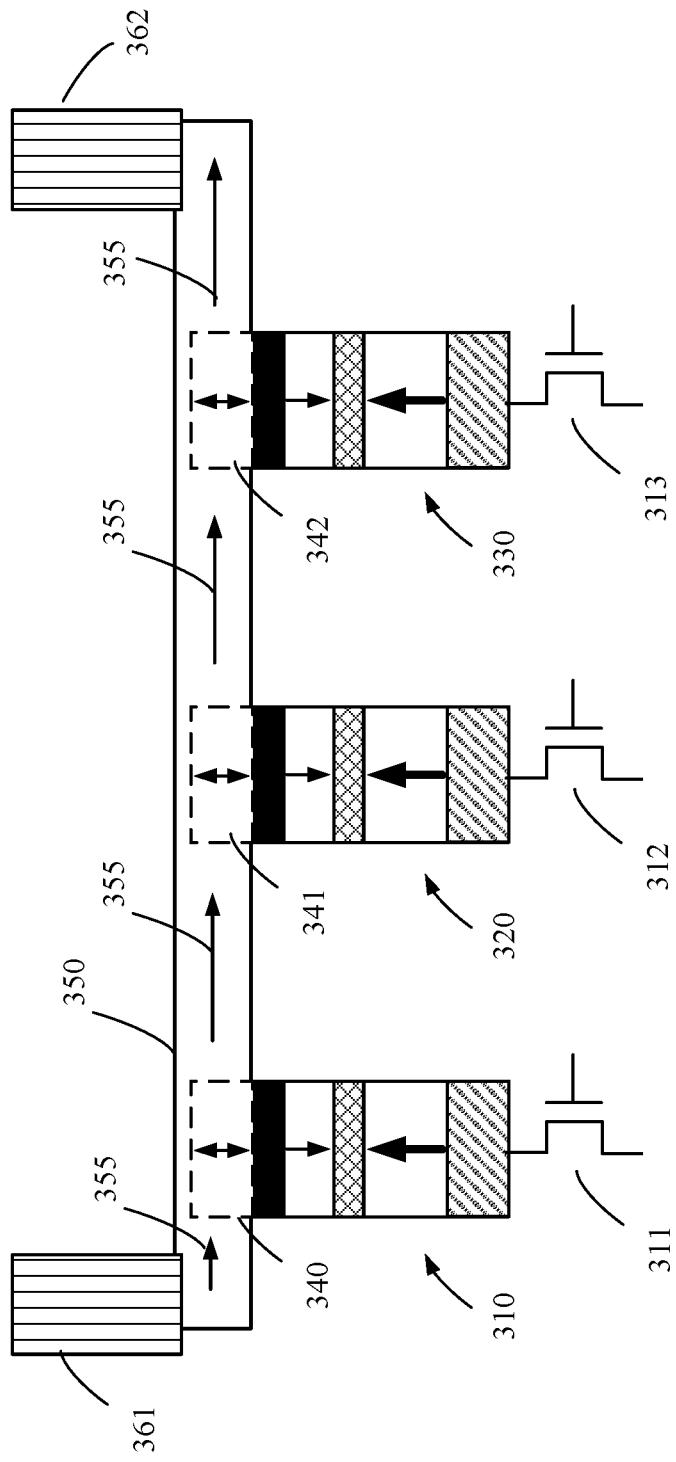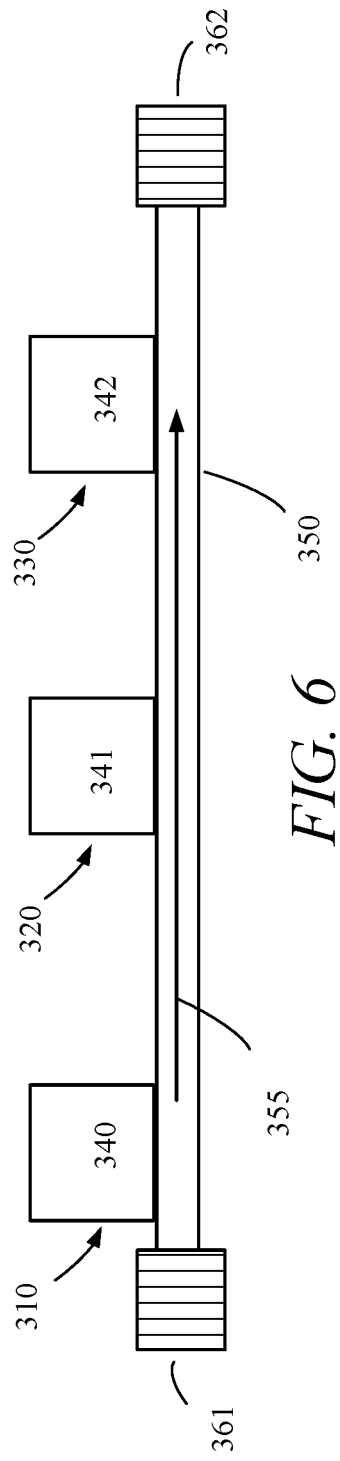
FIG. 5
FIG. 6

PERPENDICULAR MAGNETIC MEMORY USING SPIN-ORBIT TORQUE

CROSS-REFERENCE TO RELATED APPLICATIONS

This application claims the benefit of U.S. Provisional Application No. 62/571,807, filed Oct. 13, 2017, the disclosure of which is incorporated herein by reference in its entirety.

TECHNICAL FIELD

The present disclosure relates generally to spin-torque magnetic memory, and more particularly to using spin-orbit torque in a perpendicular magnetic memory.

BACKGROUND

Magnetoresistive memory devices store data based on varying the resistance across the memory device such that a read current through a memory cell in the memory device will result in a voltage drop having a magnitude that is based on the information stored in the memory cell. For example, in certain magnetic memory devices, the voltage drop across a magnetic tunnel junction (MTJ) can be varied based on the relative magnetic states of the magnetoresistive layers within the memory cell. In such memory devices, there is typically a portion of the memory cell that serves as a reference and has a fixed magnetic state. Another portion has a free magnetic state that is controlled to have magnetization either parallel or antiparallel to the fixed magnetic state. Because the resistance of the memory cell changes based on whether the magnetization of the free portion (free layer) is parallel or antiparallel to magnetization of the reference portion (reference layer), information can be stored by setting the magnetic orientation of the free layer. The information is later retrieved by sensing the resistance of the free layer. Such magnetic memory devices are well known in the art.

Writing spin-torque magnetic memory cells can be accomplished by sending a write current through the memory device where the spin angular momentum carried by the current between the reference and free layers can change the magnetic state of the free layer. Depending on the direction of the current through the memory cell (e.g. up or down), the resulting magnetization of the free layer will either be parallel or antiparallel to the reference layer. If the parallel orientation represents a logic "0", the antiparallel orientation represents a logic "1", or vice versa. Thus, the direction of write current flowing through the memory device determines whether the memory cell is written to a first state or a second state. Such memory devices are often referred to as spin-transfer torque memory devices (STT-MRAM). In such memories, the magnitude of the write current is typically greater than the magnitude of a read current used to sense the information stored in the memory cells.

Because the magnitude of write current needed to switch the memory cells can be significant, repeated application of the write current through the magnetic tunnel junction can lead to breakdown of the magnetic tunnel junction over time. Therefore, it is desirable to provide techniques for switching the free layers of memory cells in a manner that avoids breakdown issues.

BRIEF DESCRIPTION OF THE DRAWINGS

FIGS. 3 and 4 are different perspective views of the magnetic memory cell of FIG. 2 in accordance with an exemplary embodiment;

FIGS. 5 and 6 are different perspective views of a portion of a memory that includes a plurality of magnetic memory cells in accordance with an exemplary embodiment;

DETAILED DESCRIPTION

Figure 1:
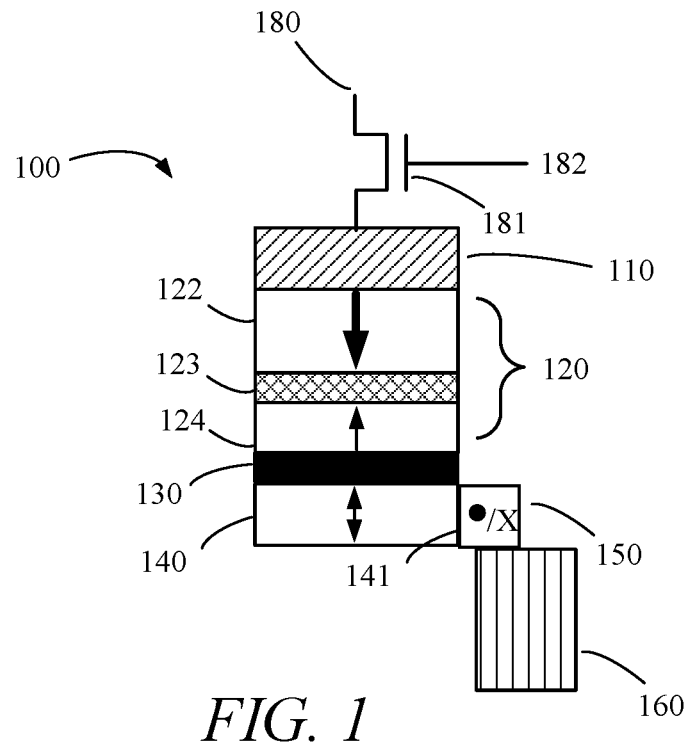
FIG. 1 is a block diagram of a magnetic memory cell in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the FIGs. depict the general structure and/or manner of construction of the various embodiments. Descriptions and details of well-known features and techniques may be omitted to avoid unnecessarily obscuring other features. Elements in the FIGs. are not necessarily drawn to scale: the dimensions of some features may be exaggerated relative to other elements to assist improve understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, the operation of standard magnetic random access memory (MRAM) and the processing techniques used to manufacture of magnetoresistive devices.

During the course of this description, like numbers may be used to identify like elements according to the different drawings that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various drawings contained herein are intended to represent exemplary functional relationships and/or physical couplings between the various elements. It should be noted that many alternative or additional functional relationships or physical connections may be present in an embodiment of the subject matter.

Embodiments described herein utilize what is often referred to as spin-orbit torque (SOT) current to switch or aid in switching the magnetic state of the free layer in a MTJ device, where such a MTJ device is often included in a memory cell in a magnetic memory. Current through a conductor adjacent to the free layer results in a spin torque acting on the free layer due to the injection of a spin current into the free layer from spin-dependent scattering of electrons in the conductor. The spin current is injected into the free layer in a direction perpendicular to the boundary where the free layer and the conductor meet. The spin torque applied to the free layer by the spin current impacts the magnetic state of the free layer in a similar manner as spin-polarized tunneling current that flows through the MTJ in conventional spin-torque magnetic tunnel junctions. The spin torque supplied by spin current can be used to change the magnetic state of the free layer just as in conventional MTJ devices used in STT-MRAM. Because the spin current is a pure spin current, and not associated with a charge current that would flow through the MTJ, it does not stress the dielectric material that forms the tunnel barrier. The spin current decays with distance as it proceeds through the free layer, where the decay distance is based on the spin diffusion length in the free layer material. When using the spin current in switching the free layer for a write or reset operations, the need for write current that flows through the tunnel barrier can be reduced or eliminated, thereby reducing tunnel junction breakdown probabilities and promoting long-term functionality of memory devices.

As with write currents in conventional spin-torque memories, when using SOT current, the direction of the torque applied by the spin current is dependent on the direction of the current flow in the conductor that is sourcing the SOT current. In other words, the direction of the current flow through the conductor adjacent to the free layer determines the direction of the torque that is applied to the free layer. As such, the free layer can be switched between two stable states based on torque applied by current flowing in the neighboring conductor in one direction or the other.

In some embodiments, the torque applied by the spin current alone is used to switch the free layers into a particular magnetic state, whereas in other embodiments, the spin current works as an "assist" to reduce the magnitude of a spin-torque write current required to switch the free layer magnetic state, where the spin-torque write current travels through the entirety of the MTJ to produce a spin polarized tunneling current between the free layer and reference layer. Reading of the data stored by the MTJ is accomplished as in a typical spin-torque MTJ memory cell. For example, a read current, which has a lesser magnitude than that of a write current required to switch the free layer, is applied to the MTJ to sense the resistance of the magnetic tunnel junction. In some embodiments, the resistance sensed based on the read current can be compared with a reference resistance to determine the state of the free layer. In other embodiments, a self-referenced read operation is performed where the resistance through the MTJ is sensed, then the MTJ is written (or reset) so that the free layer is in a known state, then the resistance is sensed again and compared with the resistance originally sensed. The original state of the free layer can then be determined based on whether the resistance sensed has changed based on the write (reset) operation.

FIG. 1 illustrates a magnetoresistive device 100 that includes a magnetic tunnel junction. FIGS. 2-13 also show magnetoresistive devices. In some embodiments, the magnetoresistive devices shown in the drawings are included in magnetic memory cells that can be used in embedded or standalone MRAM applications where high data retention and low switching current are beneficial.

Each of the magnetoresistive devices in FIGS. 1-13 includes a MTJ formed with a magnetoresistive stack that includes a plurality of layers. Each layer of the plurality of layers included in the magnetoresistive stack is formed, deposited, grown, sputtered, or otherwise provided. The layers may be deposited using any technique now known or later developed. In an example embodiment, the plurality of layers includes a number of different layers of both magnetic and nonmagnetic material. For example, the layers may include multiple layers of magnetic material, dielectric layers that provide one or more tunnel barriers or diffusion barriers, coupling layers between layers of magnetic material that provide for ferromagnetic or antiferromagnetic coupling, antiferromagnetic material, and other layers utilized in magnetoresistive stacks as currently known or later developed.

In the magnetoresistive devices, the orientations of the layers are illustrated with respect to an underlying substrate upon which the layers are formed. For example, in FIG. 1, the free layer 140 is closer to the underlying substrate than the dielectric layer 130 and the reference layer 120. Therefore, the free layer 140 is "under" the layers 130 and 120, whereas the layers 130 and 120 are over the free layer 140. Moreover, the layers 120, 130, and 140 are vertically positioned with respect to the underlying substrate. One of ordinary skill in the art appreciates that the vertical positioning of the layers is generally associated with the processing operations used to form the devices.

In the magnetoresistive device of FIG. 1, a dielectric layer 130 forms a tunnel junction between a reference magnetic layer 120 and a free magnetic layer 140. The reference layer 120, which is shown to include ferromagnetic layers 122 and 124 antiferromagnetically coupled by coupling layer 123, has a predetermined magnetic state, which, as indicated by the arrows within the reference layer 120, is perpendicular to the plane in which the various layers are deposited. Thus, the reference layer 120 has stable magnetic states with magnetization direction perpendicular to the film plane. While the reference layer 120 is illustrated to include a set of layers forming a synthetic antiferromagnetic structure or synthetic antiferromagnet (SAF), in other embodiments, it may include a set of layers forming a synthetic ferromagnetic structure (SyF). In yet other embodiments, the reference layer 120 is a single layer of material. Reference layer 120 may achieve its fixed magnetization in a number of different ways. For example, the reference layer can include antiferromagnetic material such as a platinum manganese alloy (Pt—Mn), a nickel manganese alloy (Ni—Mn) or an iridium manganese alloy (Ir—Mn), where such materials have a fixed magnetic state that can be used to influence other magnetic layers within the reference layer 120. For example, the reference layer can include a SAF having antiferromagnetic material that is used to pin other ferromagnetic layers within the SAF such that the reference layer 120 is held in a predetermined magnetic state by the antiferromagnetic material. In other embodiments, the reference layer 120 includes an unpinned SAF having a magnetization that is typically fixed during manufacturing operations, but does not rely upon antiferromagnetic material. In yet other embodiments, the fixed magnetization of the reference layer 120 is achieved through other means, including the manner in which the reference layer 120 is formed (e.g. shape anisotropy).

While the free layer 140 shown in FIG. 1 is illustrated as a single layer of material, in other embodiments the free layer 140 includes two or more ferromagnetic layers separated by one or more coupling layers. Ferromagnetic layers included in embodiments described herein may include a variety of materials, including, for example, cobalt (Co), iron (Fe), and nickel (Ni) as well as alloys such as NiFe, CoFeB, CoNi, FeB CoB, CoFeB—X (where X can be Mo, W, etc). The particular materials included in the ferromagnetic layers as well as the coupling layers can be selected in order to vary the characteristics of the magnetoresistive devices. In some embodiments one or more of the ferromagnetic layers includes multiple ferromagnetic materials that may or may not alloy together.

While not shown in FIGS. 1-10, the magnetoresistive devices can also include additional dielectric layers forming diffusion barriers or additional tunnel junctions. The magnetoresistive devices can also include spacer layers, which, when included in the stack, can increase the anisotropy of magnetic layers. In some embodiments, the dielectric layers (e.g. dielectric layer 130) included in the magnetoresistive stacks of the devices shown in FIGS. 1-10 include, for example, one or more layers of aluminum oxide and/or magnesium oxide (MgO). While an exemplary stack structure is used to illustrate the concepts of the present disclosure, it should be appreciated that a multitude of variations of the general stack structure can be used in the various embodiments of the inventions disclosed herein. For example, other embodiments may include multiple SAFs, SYFs, and tunnel barriers in addition to the other layers, where the materials and structures are arranged in various combinations and permutations now known or later developed.

In FIG. 1 a top electrode 110 is included in the device 100, there the top electrode is electrically connected to one of the current-carrying terminals of a selection transistor 181. The other current-carrying terminal of the transistor 181 can be coupled to a common line such as a bit line or a source line that allows voltages to be applied across the MTJ and current to be applied through the MTJ of device 100. The gate of transistor 181 is driven by a signal line 182, which, in one example, corresponds to a word line in a MRAM device used to select one or more memory cells. Transistor 181 allows the device 100 to be selected for read operations, and, in the case where current through the MTJ is still used during a write operation, for write operations. While the selection circuitry for the device 100 is shown as a single transistor, other selection circuits can be used to isolate one or more devices in an array of such devices. For example, multiple selection transistors (e.g., a wordline read transistor, a bitline selection transistor, and a wordline write selection transistor) may be used in combination to operably isolate one or more devices in an array of devices. One or more embodiments incorporating multiple selection transistors are described in greater detail below.

As shown in FIG. 1, an SOT control strip line 150 is provided on a first side surface 141 of the free magnetic layer 140. The perspective view provided in FIG. 1 is such that the strip line 150 runs into and out of the page. The dot/X label in the strip line 150 indicates that current can be caused to flow into the page (X) or out of the page (dot). In other words, the current in the strip line can flow in one of two directions. A single via 160 is depicted as providing an electrical connection to one end of the strip line 150. However, it should be understood that a second via or other connection is present at the other end of the strip line 150 so that current can be cause to flow through the strip line 150 between the two electrical connections to the strip line 150.

As discussed above, the electrical current in the strip line 150 causes a spin current to enter the free magnetic layer 140, where the spin current is perpendicular to the first side surface 141 of the free magnetic layer 140 and the spin current is also parallel to the film plane. The spin torque provided by the spin current resulting from the current flow through the strip line 150 can be used to switch or assist in switching the magnetic state of the free layer 140. Note that the provision of the strip line 150 on the side of the free layer 140 allows the electrical current flow through the strip line 150 to provide deterministic spin torque to the free layer 140, which has a "perpendicular" magnetic state such that the easy-axis for the free layer is in the vertical direction and perpendicular to the film plane (i.e. the plane corresponding to the formation of the films included in the stack). The easy axis for the free layer indicates that the magnetic state of the free layer will either point upward or downward in the steady state with no external magnetic fields or magnetic forces applied.

The device 100 pictured in FIG. 1 is a perpendicular device in that the easy axis of the free layer 140, as well as the easy axis of each of the magnetic layers 122 and 124 in the reference layer 120, is in the vertical direction and perpendicular to the film plane of the device 100. In some contexts, perpendicular devices such as that shown in FIG. 1 are preferable to "in-plane" devices in which the easy axis of the magnetic layers lies in the same plane as the film because the perpendicular devices are more scalable. The dimensions of perpendicular devices are more easily reduced without compromising their magnetic characteristics in comparison with in-plane devices.

The strip line 150, which may be referred to as a spin orbit torque "fin" (SOT fin), is adjacent to the free layer 140 in order to maximize the impact of the spin current injected into the free layer 140 by current flowing through the strip line 150. In some embodiments, there may be intervening material between the strip line 150 and the free layer 140 as long as the intervening material does not negate the desired impact of the spin current generated in the strip line 150 or interfere with flow of the spin current between the strip line 150 and the free layer 140. Such an intervening material may be a metal layer or a very thin dielectric layer, thin enough to allow tunneling of the spin current from the strip like 150 to the free layer 140.

In order to generate the desired spin orbit torque, the strip line 150 can be formed using material that has a strong interaction between its lattice and the spin of the charge carriers (e.g. electrons). Such a material is able to create a significant spin polarization of the scattered electrons. Examples of such as materials, which exhibit a strong Spin Hall Effect, include tantalum (Ta), tungsten (W), and platinum (Pt).

In some embodiments, when the free layer 140 is to be written to a desired state, a current is established in one of two directions in the strip line 150, where current flowing in one direction forces the magnetization of free layer 140 to a first state and current flowing in the opposite direction forces the magnetization of the free layer 140 to a second state. In such a write operation in which all of the spin torque is applied by SOT current, no current flows through the dielectric layer 130, thereby avoiding the stresses to the dielectric layer.

In other embodiments, the spin torque induced by the spin current does not completely switch the magnetic state of the free layer 140 and instead applies enough torque to allow a lesser amount of spin-torque write current through the device 100 to cause the free layer 140 to switch. In such embodiments, the selection circuitry, such as the selection transistor 181, can be used to determine whether the particular device is selected to switch. In other words, if the strip line 150 is contacting multiple devices along its length, the current through the strip line 150 may be chosen to provide only a fraction of the spin-torque needed to switch the devices, and a spin-torque switching current is applied through certain memory cells as desired to result in the switching of only those selected devices.

While the strip line 150 is depicted as covering the entirety of the side surface 141 of the free layer 140, in other embodiments the strip line 150 only covers a portion of the side surface 141 of the free layer 140. Covering more of the side surface 141 allows for more efficient injection of spin current into the free layer 140 by the strip line 150. The strip line 150 preferably does not cover any of the side surface of the dielectric layer 130. However, in some embodiments, the strip line 150 can cover a portion of the side surface of the dielectric layer 130 as long as it does not short out or otherwise adversely impact the tunnel barrier formed by the dielectric layer 130 or interfere with the operation of the device 100.

The strip line 150 is also depicted as relatively narrow in relation to the width of the device 100. The current density within the strip line 150 determines the amount of spin current generated in the free layer 140. As such, different strip line geometries can be used to optimize the strip line performance, including the line resistance per length, the required voltage bias to drive the current, and the total current through the line to achieve the highest current density. Such strip line optimization can be used to maximize the amount of spin torque applied to the free layer 140 by the current in the strip line 150 given the practical constraints of the supporting circuitry and the array architecture.

In many cases, selection circuitry such as the selection transistor 181 is formed in layers below the layers on the semiconductor substrate used to form the magnetoresistive stack that includes the free layer 140, the dielectric layer 130, and the reference layer 120. As such, complex routing through via structures and other interconnect may be required to provide the needed electrical connection between the top electrode 110 and the selection transistor 181, which may be located many layers below the top electrode 110.

Figure 2:
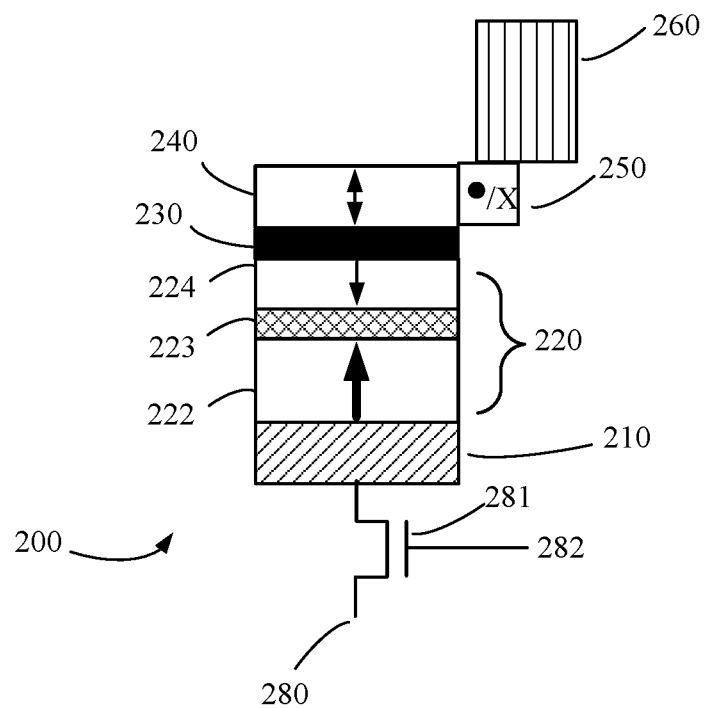
FIG. 2 is a block diagram of a magnetic memory cell in accordance with another exemplary embodiment.

In order to alleviate the complex via connection between the top electrode 110 and the selection transistor 181, an exemplary configuration in which the free layer 240 is above the reference layer 220 is depicted in FIG. 2. As shown in FIG. 2, the magnetoresistive stack of the device 200 includes a free layer 240 and a reference layer 220 with a dielectric layer 230 between the free layer 240 and the reference layer 220. In the example configuration of FIG. 2, the dielectric layer 230 acts as a tunnel barrier in the MTJ device.

As in FIG. 1, the reference layer 220 is a SAF structure. In FIG. 2, the magnetic layers 222 and 224 of the SAF are antiferromagnetically coupled by the coupling layer 223. A bottom electrode 210 is used to form a connection to a selection transistor 281 that is controlled by a signal 282 applied to the gate of the transistor 281 while another signal line (e.g. a bit line, source line, or other common line) is coupled to the terminal 280 of the transistor 281. Because the bottom electrode 210 is at the bottom of the stack, it can more readily be connected to the underlying selection transistor 281. Such a connection can be established with a single via in some embodiments, thereby avoiding the more complicated connection that might be required for the device 100 of FIG. 1.

In FIG. 2, the SOT control strip line 250 is on a side surface of the free layer 240 and is used to provide a spin current to the free layer 240 in order to switch or assist in switching the magnetic state of the free layer 240. As was the case with FIG. 1, only one of the vias 260 that provides an electrical connection to the strip line 250 is shown in FIG. 2, where it should be understood that the strip line 250 extends into and out of the page and there is an electrical connection at each end of the strip line 250 such that current can be made to flow in either direction through the strip line 250.

In some embodiments, each of the devices 100 and 200 is a stand-alone three-terminal device. In other words, each of the devices 100 and 200 has three terminals that are used to apply the different voltages and currents used to read data from and write data to the devices 100 and 200. In such embodiments, the selection transistors 181 and 281 may or may not be included as direct connections to the terminals can be without selection circuitry for each device. The terminals for each three-terminal device include the top or bottom electrode plus the two connection points to the strip line. Thus for device 100, the top electrode 110 is one terminal, the via 160 is a second terminal, and the other connection to the other end of the strip line 150 (which is not shown) is the third terminal.

In yet other embodiments, a fourth terminal is provided. For example, in the device 100 of FIG. 1, a bottom electrode could be formed under the free layer 140 where a selection transistor is coupled to the free layer 140 by another via between the selection transistor and the free layer 140. Having such an additional terminal can allow normal spin torque reading and writing to occur while still having the ability to provide spin current from the strip line 150. In such an example, the strip line 150 can be used to perform reset writing operations that impact many memory cells adjacent to the strip line, whereas the top and bottom electrode connections can be used for individual memory cell writes and reads.

FIGS. 3 and 4 illustrate different perspective views of device 200 of FIG. 2 in an embodiment where device 200 is a stand-alone three-terminal device. While FIG. 2 depicts a side view of device 200, FIG. 3 depicts a view from a side of the device corresponding to where the spin-orbit-torque control strip line has been formed. FIG. 4 depicts a view from above looking down at the top of the stack. As shown in the view depicted in FIG. 3, the free layer 240 is behind the spin-orbit-torque control strip line 250. A dotted-line border is used to indicate that the free layer 240 is behind the strip line 250. The top-down perspective of FIG. 4 helps to illustrate the free layer 240 being positioned adjacent to the strip line 250.

As shown in FIGS. 3 and 4, the first via 260 connects to one end of the strip line 250 and the second via 261 connects to the other end of the strip line 250. By applying a voltage across vias 260 and 261, current 255 is caused to flow through the strip line 250, where the direction of the current is based on the voltages applied. Writing to the MTJ can be accomplished by applying an appropriate current through the strip line 250 to cause the free layer 240 to be forced into a magnetic state corresponding to the desired data value to be written.

For a read, sensing operations are performed by flowing a read current through the device 200 using the transistor 281 (if present) and one or both of the vias 260 and 261. In some embodiments, the resistance sensed is compared with a reference resistance. In other embodiments, the resistance is sensed, then the device 200 is reset to a known state using current through the strip line 250, and then a second sensing operation is performed to determine if the magnetic state of the free layer 240 was changed by the reset operation.

Having each device as a stand-alone three-terminal device may provide advantages in terms of device selection as well as ease of control of the voltages and currents applied to each device. However, such three-terminal devices require relatively large amounts of die area. Large devices that do not efficiently use die area are limited in storage capacity.

In other embodiments, the spin-orbit-torque control strip line runs along a plurality of free layers for a plurality of devices. An example of such an embodiment is shown in FIGS. 5 and 6, which provide similar perspectives as FIGS. 3 and 4. In FIG. 5, three devices 310, 320, and 330 are positioned along the strip line 350. Each device instantiation can be of similar structure to that shown in FIG. 2, where the free layers 340-342 are shown to be behind the spin-orbit-torque control strip line 350. Vias or other connections 361 and 362 are at the end of the strip line 350 and enable current 355 to be induced in strip line 350, where the direction of the current 355 depends on the voltages applied at the vias 361 and 362. As shown in FIG. 6, each of the free layers 341-342 abuts the strip line 350. Each of the devices 310, 320, and 330 is coupled to a respective selection transistor 311-313.

In operation, the strip line 350 can be used to simultaneously write to all of the devices 310, 320, and 330. Such a simultaneous write can be valuable in situations in which a large number of memory cells are to be cleared or reset. For example, in an activate operation corresponding to an MRAM that supports a protocol similar to that of a synchronous dynamic random access memory (SDRAM), the data from an entire row of memory cells is read into a cache or other form of temporary storage so that read and write operations for that row of memory cells can occur. If such an activate utilizes a self-referenced read operation, than an entire row of memory cells are reset to the known state between the first and second sensing operations. Performing such a reset operation to the entire row using the strip line 350 can increase the speed of such an activate operation and greatly reduce the stress placed on the tunnel barriers in the tunnel junctions included in the row of memory cells.

Individual memory cells can be read from or written to using the selection transistors 311-313. For example, the device 310 can be selected by turning on transistor 311 such that current flow for reading or writing can be applied to the device 310 using one or both of the vias 361 and 362 in combination with the lower current-carrying terminal of the transistor 311. In a write operation, the spin torque applied to the free layer 340 by current flowing through the device 310 can be supplemented with spin torque from a spin current resulting from current flowing through the strip line 350. In some embodiments, multiple devices can be selected and written to or read from in parallel, whereas in other embodiments, the write or read operations for individual devices can be staggered in time such that the current flow through the individual magnetic tunnel junctions is not diluted. Thus, in the embodiment show in FIGS. 5 and 6, the strip line 350 can be used to write a plurality of memory cells at the same time or can be used as an assist to provide some spin torque so that the amount of write current that flows through the magnetic tunnel junctions can be reduced, thereby alleviating some of the breakdown stress on the tunnel junction.

Figure 7:
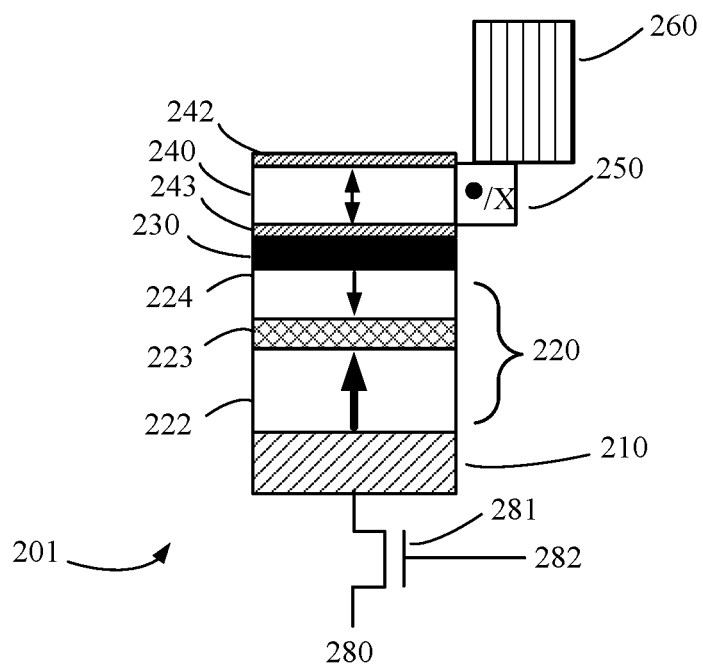
FIG. 7 is a block diagram of a magnetic memory cell in accordance with another exemplary embodiment.

In some MTJ stacks, the perpendicular magnetic anisotropy (PMA) of the free layer is enhanced by placing layers of material, such as MgO or other material, at the top and bottom surfaces of the free layer. Such increased PMA can help to make the free layer strongly perpendicular such that the magnetic state of the free layer 240 is stable enough to resist moderate applied magnetic fields and elevated temperatures. Higher PMA can also help the magnetic state used to store data for long periods of time. FIG. 7 shows such an embodiment in which layers 242 and 243 are placed at the top and bottom surfaces of the free layer. Note that in some spin current applications, the SOT strip line is placed on the top or bottom surface of the free layer. Such a placement of the spin-orbit-torque control strip line may not allow a layer of material such as MgO to be placed on the surface of the free layer that is abutted to the spin control strip line. However, as shown in FIG. 7, placing the strip line 250 on the side surface of the free layer 240 allows layers 242 and 243 to be placed on both sides of the free layer 240. It should be noted that the dielectric layer 230, which is often MgO or the like, can provide the increased PMA for the bottom surface of free layer 240 such that an additional layer 243 is not required.

Figure 8:
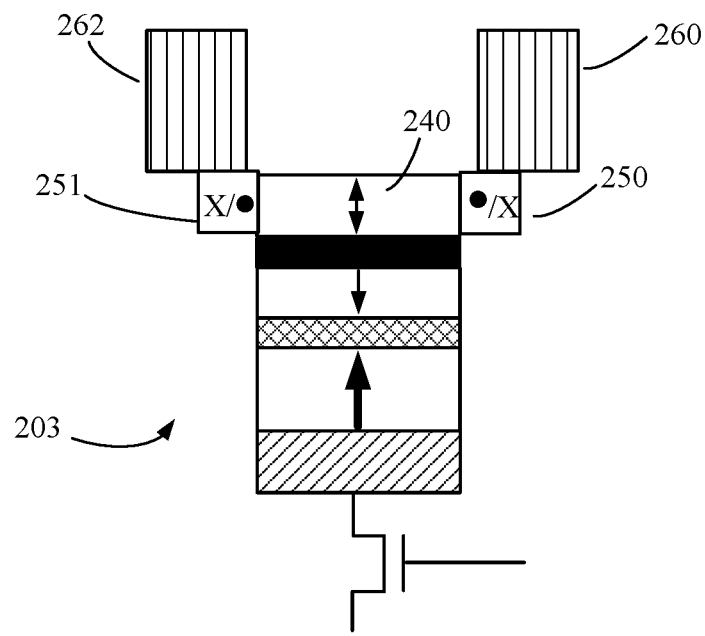
FIG. 8 is a block diagram of a magnetic memory cell in accordance with another exemplary embodiment.

FIG. 8 illustrates another embodiment in which multiple strip lines 250 and 251 are provided along multiple surfaces of the free layer 240. In the embodiment 203 shown in FIG. 8, the current through the strip line 250 is in one direction while the current through the strip line 251 is in the opposite direction. Thus, the SOT applied by current flowing through line 250 adds to the SOT applied by current flowing through line 251. Such complementary strip lines can reduce the required current density in each strip line in comparison to embodiments with only a single strip line.

Figure 9:
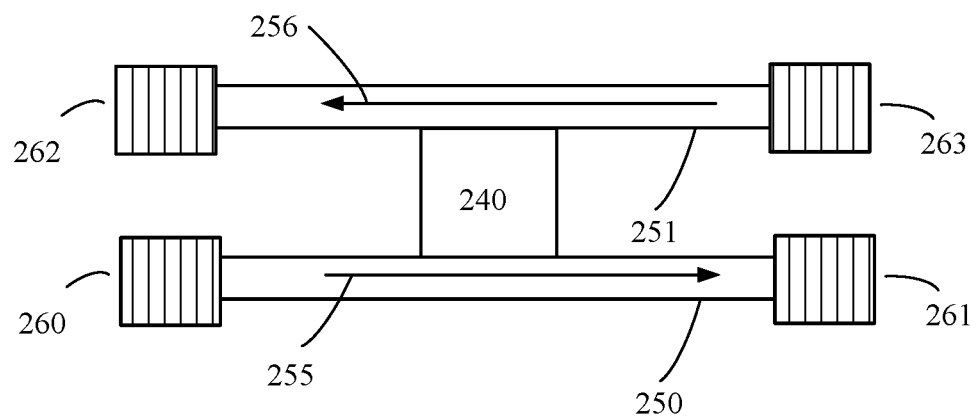
FIGS. 9 and 10 are top-down perspective views of the magnetic memory cell of FIG. 8 in accordance with exemplary embodiments.

FIG. 9 shows a top view of one embodiment corresponding to FIG. 8 in which two separate strip lines 250 and 251 are driven separately using four vias 260-263. Each of the strip lines 250 and 251 can be driven independently, thereby allowing for varying amounts of spin torque to be applied by the currents 255 and 256.

Figure 10:
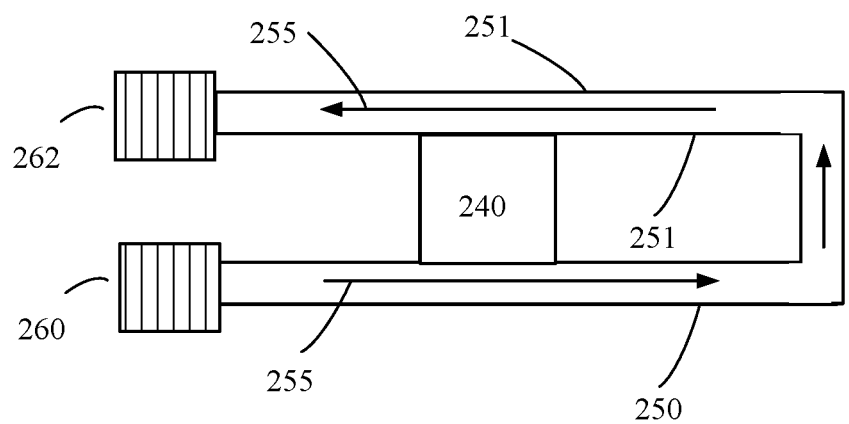

FIG. 10 shows a top view of another embodiment corresponding to FIG. 8 in which a single strip line that includes strip line segments 250 and 251 is driven using vias 260 and 262. In the embodiment of FIG. 10, a single current 255 goes past the free layer 240 on two separate sides in two opposite directions. The flexibility of varying two separate currents is not present in the embodiment of FIG. 10, but fewer vias are required and the connections are all on the same side of the free layer, which may provide for easier routing of certain signals.

As described previously, in some embodiments, each magnetoresistive device is a stand-alone three-terminal device. In other words, each device has three terminals that may be used to apply different voltages and currents used to read data from and write data to each magnetoresistive device. Each terminal may have a selection transistor (or other suitable selection device) and each selection transistor may be connected to the device via an interface of an electrode or other conductive region.

Figure 11:
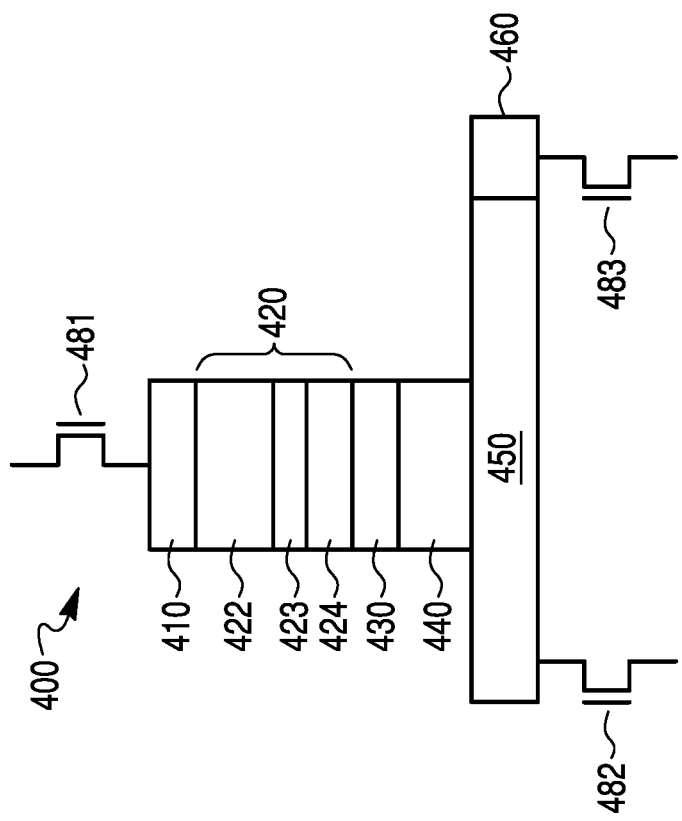
FIG. 11 is a block diagram of a magnetic memory cell in accordance with an exemplary embodiment.

In at least one exemplary embodiment, such as the one shown in FIG. 11, each of the three terminals may be connected to a selection transistor (e.g., wordline read selection transistor 481, bitline selection transistor 482, and wordline write selection transistor 483). Still referring to FIG. 11, the magnetoresistive device 400 includes a free layer 440 and a reference layer 420 with a dielectric layer 430 between the free layer 440 and the reference layer 420. In the example configuration shown in FIG. 11, the dielectric layer 430 acts as a tunnel barrier in the MTJ device. Reference layer 420 may be a SAF or SyF structure, such as, for example, a SAF having magnetic layers 422 and 424 antiferromagnetically coupled by the coupling layer 423. While strip line 450 is depicted as covering (or otherwise extending across) an entire surface of free layer 440, in other embodiments the strip line 450 only covers (or otherwise extends across) a portion of one or more surfaces of free layer 440. The amount of spin current injected into free layer 440 from strip line 450 is positively correlated and directly proportional to the surface area of free layer 440 covered by strip line 450. Strip line 450 preferably does not cover (or is otherwise in contact with) a surface of dielectric layer 430, but in some embodiments, strip line 450 may cover a portion of a surface of dielectric layer 430 as long as it does not short out the tunnel barrier formed by dielectric layer 430.

A via 460 may connect strip line 450 to the wordline write selection transistor 483. Although only one magnetoresistive device 400 is shown in FIG. 11, via 460 extends into and out of the page and may connect with strip lines 450 of other magnetoresistive devices 400.

Figure 12:
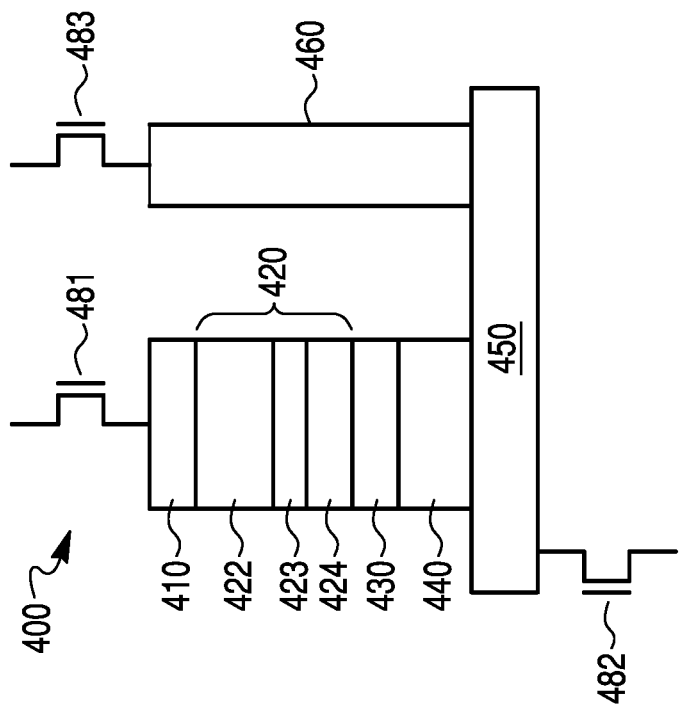
FIG. 12 is a block diagram of a magnetic memory cell in accordance with yet another exemplary embodiment.

In another embodiment, such as the one shown in FIG. 12, a magnetoresistive device 400 includes a free layer 440 and a reference layer 420 with a dielectric layer 430 between the free layer 440 and the reference layer 420. In the example configuration shown in FIG. 12, the dielectric layer 430 acts as a tunnel barrier in the MTJ device. A via 460 may extend parallel to magnetoresistive device and perpendicular to strip line 450 connecting the strip line 450 to the word line through a wordline write selection transistor 483. In some embodiments, wordline write selection transistor 483 and wordline read selection transistor 481 may connect to the same line.

In such three-terminal examples, a strip line 450 may be used to reset or write a plurality of magnetoresistive devices (e.g., magnetoresistive device 400) adjacent to strip line 450. In such embodiments, a lower voltage or lower charge current may be passed from wordline read selection transistor 481 to bitline selection transistor 482 to measure the resistance of a particular magnetoresistive device 400 without passing a write current along strip line 450. Similarly, a high voltage or high charge current may be passed from wordline write selection transistor 483 to bitline selection transistor 482, along strip line 450, to write or reset the magnetic moment of free layer 440 without passing the write current through the dielectric layer 430, increasing the lifespan and durability of dielectric layer 430.

Figure 13:
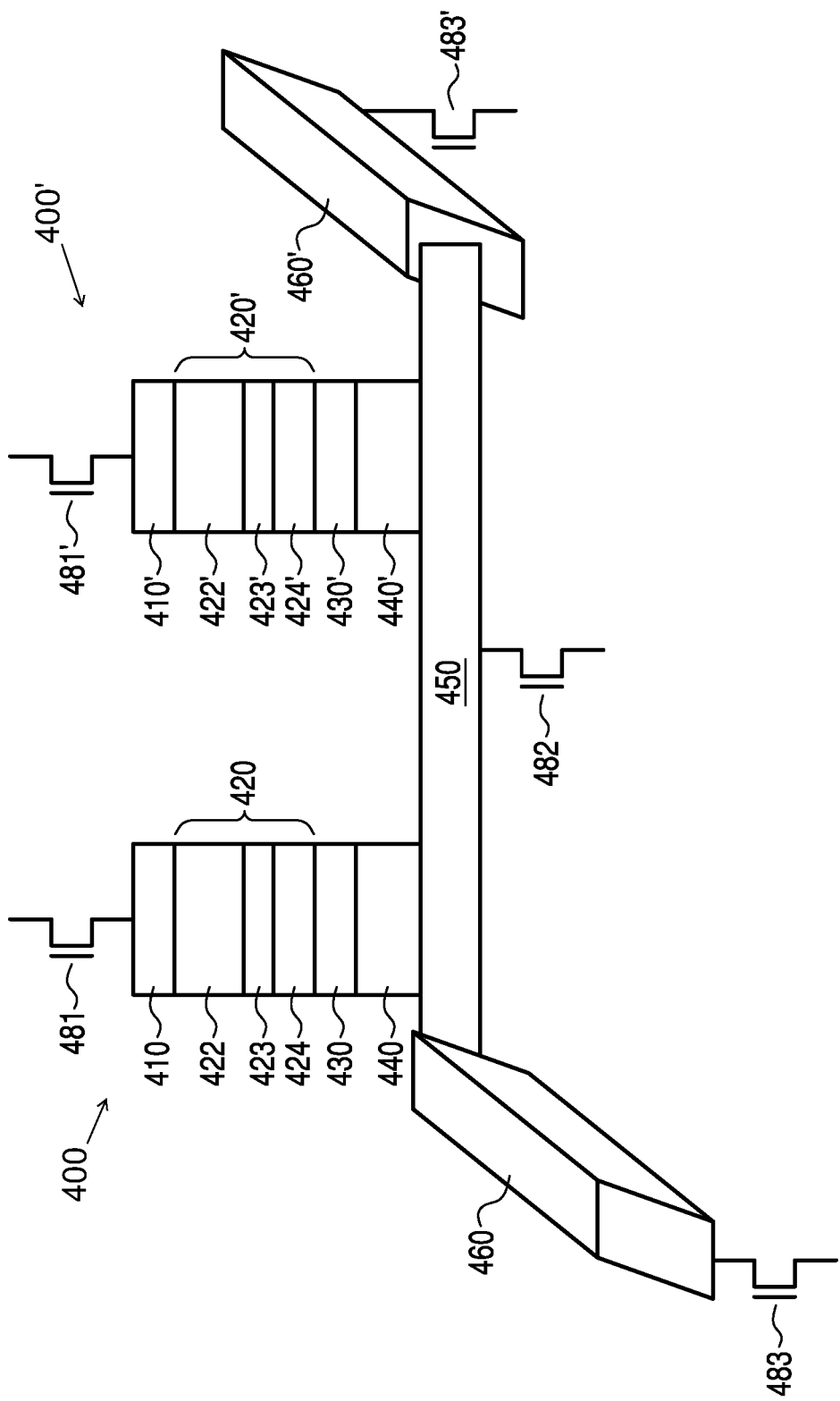
FIG. 13 is a perspective view of a portion of a memory that includes a plurality of magnetic memory cells in accordance with another exemplary embodiment.

In yet another exemplary embodiment, such as the one shown in FIG. 13, a plurality of three-terminal magnetoresistive devices 400 may be incorporated to share use of one or more transistors and/or strip line 450. As shown in FIG. 13, magnetoresistive devices 400, 400' are formed adjacent (e.g., above) strip line 450. Each magnetoresistive device 400, 400' has a free layer 440, 440' adjacent (e.g., in contact) to strip line 450. Further, each magnetoresistive device 400, 400' is connected to a wordline read selection transistor 481, 481' and a wordline write selection transistor 483, 483' through vias 460, 460', respectively. Each via 460, 460' may connect to a plurality of strip lines 450, e.g., extending parallel to the depicted strip line 450.

Still referring to FIG. 13, during read or write operations, strip line 450 may be used to simultaneously write to all connected magnetoresistive devices 400, 400'. Such a simultaneous write may be valuable in situations in which a large number of memory cells are to be cleared or reset, as previously explained. Performing such operations to an entire row of magnetoresistive devices 400, 400' using strip line 450 may increase the speed of such operations and may reduce the stress placed on the tunnel barriers in the tunnel junctions included in the row of magnetoresistive devices 400, 400'. Individual magnetoresistive devices 400, 400' may be read or written to using wordline read selection transistors 481, 481', wordline write selection transistors 483, 483, and bitline selection transistor 482. For example, device 400 may be read by passing a low charge read current from wordline read selection transistor 481 to bitline selection transistor 482. In addition, device 400 may be written by passing a high charge write current from wordline write transistor 483, through via 460, along strip line 450, to bitline selection transistor 482. Reading and writing processes for device 400' may be accomplished in similar manners. In some embodiments, multiple devices can be selected and written to or read from in parallel, whereas in other embodiments, the write or read operations for individual devices can be staggered in time such that the current flow through an individual magnetic tunnel junction is not diluted.

Different techniques can be employed to manufacture the devices that include the SOT control strip lines. In some embodiments, a trench is formed in the dielectric material adjacent the free layer, and then the trench is filled with the appropriate material for the strip line. In some embodiments, forming the trench simultaneously etches the side wall of the free layer in order to ensure that the free layer side wall is adjacent to and abuts the strip control line. In some embodiments, deposition of the material for the strip line can be accomplished using anisotropic deposition using an ion beam.

As disclosed herein, spin control strip lines are provided along the sides of free layers in perpendicular MTJ devices. Such SOT control strip lines provide spin current to the free layers such that spin-orbit torque is applied to the free layers in a manner that can alter the magnetic state of the free layers. The spin-orbit torque can be used to force the magnetic state of the free layer to a particular state based on the direction of the current through the spin control strip line. In other embodiments, the spin current provides an assist to spin-torque generated by current flowing vertically through the magnetic tunnel junction. Some embodiments have dedicated strip lines for a single MTJ such that a three-terminal device results. Other embodiments have multiple magnetic tunnel junctions sharing a strip line, where the strip line can be used to reset all of the magnetic tunnel junctions to the same state and can also be used as an assist such that individual magnetic tunnel junctions can be written using selection circuitry such as a selection transistor paired with each magnetic tunnel junction.

Figure 14A:
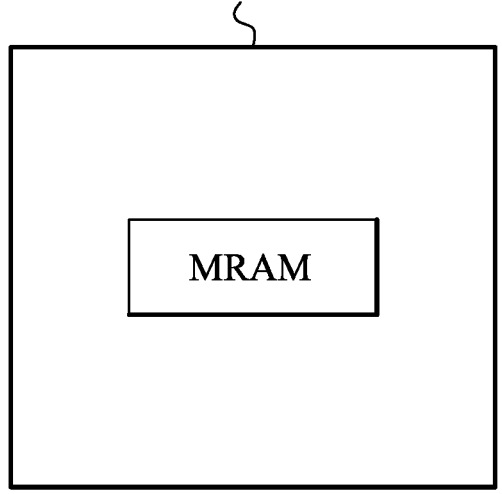
FIGS. 14A-B are schematic block diagrams of integrated circuits including a discrete memory device and an embedded memory device, each including MRAM (which, in one embodiment is representative of one or more arrays of MRAM having a plurality of magnetoresistive memory stacks/structures, according to aspects of certain embodiments of the present disclosure.
Figure 14B:
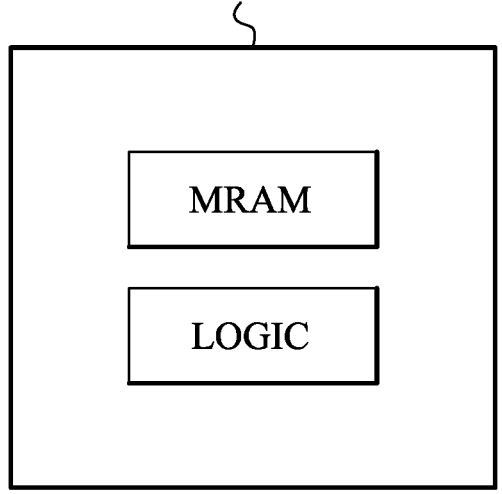

Magnetoresistive stacks, structures, and devices of the current disclosure may be used in any suitable application, including, e.g., in a memory configuration. In such instances, magnetoresistive stacks, structures, and devices may be formed as integrated circuits comprising a discrete memory device (e.g., as shown in FIG. 14A) or an embedded memory device having a logic therein (e.g., as shown in FIG. 14B), each including MRAM, which, in one embodiment is representative of one or more arrays of MRAM having a plurality of magnetoresistive stacks/structures, according to certain aspects of certain embodiments disclosed herein.

Although the described exemplary embodiments disclosed herein are directed to various magnetoresistive-based devices, the present disclosure is not necessarily limited to the exemplary embodiments. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A memory, comprising:
    a first magnetic tunnel junction that includes:
        a free magnetic layer;
        a reference magnetic layer; and
        a dielectric layer between the free magnetic layer and the reference magnetic layer; and
    a first spin-orbit-torque control strip line on a first side surface of the free magnetic layer, wherein current in the first spin-orbit-torque control strip line causes spin current in the free magnetic layer, wherein the spin current is perpendicular to the first side surface of the free magnetic layer, and where the first side surface of the free magnetic layer is perpendicular to an interface of the free magnetic layer and the dielectric layer.

2. The memory of claim 1, wherein the free magnetic layer is under the dielectric layer.

3. The memory of claim 1, wherein the free magnetic layer is bordered by dielectric layers at both the top and bottom surfaces, wherein one of the dielectric layers is the first dielectric layer.

4. The memory of claim 1, wherein the free layer includes two ferromagnetic layers separated by a coupling layer.

5. The memory of claim 1 further comprising:
    a selection transistor coupled to the free magnetic layer.

6. The memory of claim 1, wherein the free magnetic layer is over the dielectric layer.

7. The memory of claim 6, further comprising:
    a selection transistor coupled to the reference magnetic layer, wherein the selection transistor is formed below the reference magnetic layer.

8. The memory of claim 1, wherein the reference magnetic layer is a synthetic antiferromagnet.

9. The memory of claim 1, wherein the free magnetic layer, the dielectric layer, and the reference magnetic layer are vertically positioned in the first magnetic tunnel junction with respect to an underlying substrate, and wherein an easy axis for each of the free magnetic layer and the reference magnetic layer is in a vertical direction.

10. The memory of claim 1 further comprising a second magnetic tunnel junction that includes:
    a free magnetic layer;
    a reference magnetic layer; and
    a dielectric layer between the free magnetic layer and the reference magnetic layer, wherein the first spin-orbit-torque control strip line is on a first side surface of the free magnetic layer of the second magnetic tunnel junction, wherein current in the first spin-orbit-torque control strip line causes spin current in the free magnetic layers of both the first and second magnetic tunnel junctions, wherein the spin current in each of the first and second magnetic tunnel junctions is perpendicular to the first side surface of the free magnetic layer.

11. The memory of claim 10, further comprising first and second selection transistors respectively coupled to the first and second magnetic tunnel junctions.

12. The memory of claim 1, wherein the spin current caused by the current in the first spin-orbit-torque control strip line provides sufficient spin torque to the free magnetic layer to cause the free magnetic layer to switch between a first magnetic state and a second magnetic state.

13. The memory of claim 1 further comprising a second spin-orbit-torque control strip line on a second side surface of the free magnetic layer, wherein current in the second spin-orbit-torque control strip line causes spin current in the free magnetic layer, wherein the spin current is perpendicular to the second side surface of the free magnetic layer.

14. An apparatus, comprising:
    a magnetic tunnel junction that includes:
        a free layer, wherein the free layer has a magnetic state, wherein an easy axis for the magnetic state of the free layer is perpendicular to a film plane in which the free layer is formed;
        a dielectric layer under the free layer; and
        a reference layer under the dielectric layer, the reference layer having stable magnetic states with magnetization direction perpendicular to the film plane; and
    a spin-orbit-torque control strip line on a side surface of the free layer, wherein the side surface is perpendicular to the film plane and current in the spin-orbit-torque control strip line causes spin current in the free layer, wherein the spin current is perpendicular to the side surface of the free magnetic layer and parallel to the film plane.

15. The apparatus of claim 14, wherein the reference layer is a synthetic antiferromagnet.

16. The apparatus of claim 15 further comprising a selection transistor coupled to the reference layer.

17. The apparatus of claim 15 further comprising a bottom electrode between the reference layer and the selection transistor.

18. A spin-torque magnetic memory, comprising:
    a first plurality of magnetic tunnel junctions, wherein each magnetic tunnel junction includes:
        a free layer, wherein the free layer has a magnetic state, wherein an easy axis for the magnetic state of the free layer is perpendicular to a film plane in which the free layer is formed;
        a dielectric layer under the free layer; and
        a reference layer under the dielectric layer, the reference layer having a magnetic state perpendicular to the film plane;
    a first spin-orbit-torque control strip line that extends along a side surface of each of the free layers of the first plurality of magnetic tunnel junctions, wherein the side surface for each free layer is perpendicular to the film plane and current in the spin-orbit-torque control strip line causes a spin current in each of the free layers, wherein the spin current is parallel to the film plane; and
    selection circuitry coupled to the first plurality of magnetic tunnel junctions, wherein the selection circuitry allows at least one of the magnetic tunnel junctions in the first plurality of magnetic tunnel junctions to be selected to allow current flow through the at least one of the magnetic tunnel junctions selected.

19. The spin-torque magnetic memory of claim 18, wherein the spin current caused by the current in the spin-orbit-torque control strip line provides sufficient spin torque to the free magnetic layer in each of the magnetic tunnel junctions to set the free magnetic layer to a first magnetic state.

20. The spin-torque magnetic memory of claim 18 further comprising read circuitry coupled to the selection circuitry, wherein the read circuitry determines a data bit corresponding to the magnetic state of the free layer in a selected magnetic tunnel junction selected by the selection circuitry.

21. The spin-torque magnetic memory of claim 20, further comprising a via, wherein the via couples a line of the read circuitry to the spin-orbit-torque control strip line.

22. The spin-torque magnetic memory of claim 18, wherein the selection circuitry comprises a transistor coupled to the spin-orbit-torque control strip line, wherein the interface of the transistor to the spin-orbit-torque control strip line is not co-axial to any of the plurality of magnetic tunnel junctions.

* * * * *